(12) United States Patent
Bayko

(10) Patent No.: US 6,922,101 B2
(45) Date of Patent: Jul. 26, 2005

(54) PHASE SHIFT MODULATION CLASS D AMPLIFIER

(76) Inventor: Alan Bayko, 115 Hall Crescent, Saskatoon, SK (CA), S7L 7G7

( * ) Notice: Subject to any disclaimer, the term of this patent is extended or adjusted under 35 U.S.C. 154(b) by 47 days.

(21) Appl. No.: 10/741,148

(22) Filed: Dec. 19, 2003

(65) Prior Publication Data
US 2004/0140848 A1 Jul. 22, 2004

(30) Foreign Application Priority Data
Dec. 23, 2002 (CA) .............................. 2414965

(51) Int. Cl.[7] .............................................. H03F 3/38
(52) U.S. Cl. ...................... 330/10; 330/207 A; 330/251
(58) Field of Search .............................. 330/10, 207 A, 330/251

(56) References Cited

U.S. PATENT DOCUMENTS

| | | | | |
|---|---|---|---|---|
| 4,992,751 A | * | 2/1991 | Attwood et al. ............ | 330/10 |
| 5,075,634 A | * | 12/1991 | French ......................... | 330/146 |
| 6,026,126 A | * | 2/2000 | Gaetano ...................... | 375/296 |
| 6,392,476 B1 | * | 5/2002 | Rodriguez ................... | 330/10 |
| 6,496,059 B1 | | 12/2002 | Nguyen | |

* cited by examiner

Primary Examiner—Patricia Nguyen
(74) Attorney, Agent, or Firm—Law Offices of Albert Wai-Kit Chan, LLC

(57) ABSTRACT

An amplifier comprises a transformer comprising a primary coil and a secondary coil having a center tap on the secondary coil connected to a reference point. A constant periodic signal generator is connected to the primary coil. A signal reception and amplification circuit comprises a first switch connected between a first end of the secondary coil and an output node; and a second switch connected between a second end of the secondary coil and the output node, such that a first voltage at the first switch is substantially inverse to a second voltage at the second switch; a phase shift modulator operative to convert the input signal to a phase shift modulated input signal connected to a control input of the first switch such that the first switch turns on and off in response to changes in the phase shift modulated input signal; an inverter control operatively connected to the control input of each switch, and operative to turn the second switch off when the first switch is turned on, and vice versa; and a filter connected to the output node.

9 Claims, 5 Drawing Sheets

PHASE SHIFT MODULATION CLASS D AMPLIFIER

This invention is in the field of electronic devices and in particular Class D amplifiers.

BACKGROUND

Conventional topologies for class D amplification (sometimes called class T amplification) are based on a system where there are two DC supply rails carrying inverse DC voltages, one at voltage +V and the other at −V. A pair of switches are provided, each of which closes between a common junction and one of the supply rails. When one switch is open the other is closed such that the voltage at the common junction is either +V or −V.

It should also be noted that since the system must be operated such that both switches are never closed at the same time, thereby causing a direct short circuit, it is necessary that for a short period of time, both switches are open. For the purposes of this description, however, the voltage at the common junction is either +V or −V.

A control circuit opens and closes the switches, causing the voltage at the common junction to change back and forth between +V and −V. The input of a low pass filter is connected to the common junction to remove the high frequency switching components from the signal and the output of the filter is connected to the transducer to reproduce the amplified output signal. The transducer can also provide the effect of a low pass filter such that a separate filter is not required. This is used for audio amplifiers, power inverters, motor control and many other applications.

There are many different techniques for determining the control circuit that operates the switches. These range from a fixed frequency pulse width modulation (PWM) to variable frequency direct digital modulation.

The conventional class D topologies have several drawbacks. In order to control the switches, the control circuit must be able to withstand the voltage on the rails, which can be quite high, and yet switch very fast. The switches are usually field effect transistors (FETs) or bipolar junction transistors (BJTs) which require that the control be within a few volts of the source or emitter.

The conventional class D topology does not provide isolation between the incoming power supply and the output connections. This means that for any application running off the AC power lines, a power supply is required that provides this isolation.

The conventional class D topology is only able to get the output voltage to swing between the +V and −V available at the supply rails. If the available supply voltage is too low or too high, then an additional DC/DC converter is required to generate the appropriate voltages.

Unless the conventional class D topology is run in a bridged configuration, a problem known as supply pumping may be seen. When one of the switches in the pair closes, the current in the filter inductor increases. When the first switch opens, the other has to close or a voltage spike results. Since the inductor current cannot instantaneously change, the inductor will now draw the current from the other supply. This converts power from one supply to the other so as one supply is loaded, the other will need to absorb power.

SUMMARY OF THE INVENTION

It is the object of the present invention to provide a class D amplifier that overcomes problems in prior art amplifiers. It is the object of the present invention to provide a class D amplifier wherein the input circuit is isolated from the power supply. It is a further object of the present invention to provide such an amplifier that also isolates the output from the from the power supply. It is a further object of the present invention to provide such an amplifier wherein the output voltage is not limited by the voltage of the power supply.

In a first embodiment the invention provides an amplifier apparatus for amplifying an input signal. The apparatus comprises a transformer comprising a primary coil and a secondary coil having a center tap on the secondary coil connected to a reference point. A constant periodic signal generator is operatively connected to the primary coil. A signal reception and amplification circuit comprises a first switch connected at a hot terminal thereof to a first end of the secondary coil and at a switched terminal thereof to an output node; and a second switch connected at a hot terminal thereof to a second end of the secondary coil and at a switched terminal thereof to the output node, such that a first voltage at the hot terminal of the first switch is substantially inverse to a second voltage at the hot terminal of the second switch, with respect to the reference point; a phase shift modulator operative to convert the input signal to a phase shift modulated input signal with respect to the constant periodic signal, and wherein the phase shift modulated input signal is connected to a control input of the first switch such that the first switch turns on and off in response to changes in the phase shift modulated input signal; an inverter control operatively connected to the control input of each switch, and operative to turn the second switch off when the first switch is turned on, and operative to turn the second switch on when the first switch is turned off; and a filter connected to the reference point and operatively connected at an input end thereof to the output node, and at an output end thereof to an amplified signal output.

In a second embodiment the invention provides an amplifier apparatus for amplifying an input signal. The apparatus comprises a voltage transforming device comprising a primary input and a secondary output having a center tap on the secondary output connected to a reference point. A constant periodic signal generator is operatively connected to the primary input. A signal reception and amplification circuit comprises a first switch connected at a hot terminal thereof to a first end of the secondary output and at a switched terminal thereof to an output node and a second switch connected at a hot terminal thereof to a second end of the secondary output and at a switched terminal thereof to the output node, such that a first voltage at the hot terminal of the first switch is substantially inverse to a second voltage at the hot terminal of the second switch, with respect to the reference point; a phase shift modulator operative to convert the input signal to a phase shift modulated input signal with respect to the constant periodic signal, and wherein the phase shift modulated input signal is connected to a control input of the first switch such that the first switch turns on and off in response to changes in the phase shift modulated input signal; an inverter control operatively connected to the control input of each switch, and operative to turn the second switch off when the first switch is turned on, and operative to turn the second switch on when the first switch is turned off; and a filter connected to the reference point and operatively connected at an input end thereof to the output node, and at an output end thereof to an amplified signal output.

Voltage transforming devices most commonly take the form of a conventional transformer where separate primary and secondary coils are wound around a common core such that the two coils are only magnetically connected, and are electrically isolated. Other such voltage transforming devices are known however and could be used as well. In an autotransformer, the primary and secondary coils are magnetically and electrically connected, with output and reference taps appropriately disposed on the coil. In a resonant tank circuit the primary and secondary outputs and reference taps may be produced using a Norton's Capacitive or Inductive transformer.

By using a voltage transforming device, the signal reception and amplification circuit can be operated at a higher or lower voltage than the primary or power circuit, and the input circuit is isolated from the power supply. By using a conventional transformer with separate primary and secondary coils as the voltage transforming device, the signal reception and amplification circuit can also be electrically isolated from the primary circuit, so that the output is electrically isolated from the power supply.

In the conventional pulse width modulated class D amplifier the signals (either supply or switch control) are not periodic, since the shape of the waveform changes depending on the desired output, and the desired output signal is contained in the DC (or average) component of the signal. In contrast, the switch control signals and the periodic signal generator of the phase shift modulated class D amplifier of the invention are periodic and the desired output signal is contained in the phase shift between two high frequency signals. This allows the high frequency signals to be coupled to the switching devices using pulse transformers which filter off the DC and low frequency components of the signal. The transformers in the switch control circuit can be used to provide isolation of the control circuit from the high voltages that may be present at the load or source.

DESCRIPTION OF THE DRAWINGS

While the invention is claimed in the concluding portions hereof, preferred embodiments are provided in the accompanying detailed description which may be best understood in conjunction with the accompanying diagrams where like parts in each of the several diagrams are labeled with like numbers, and where:

Figure 1:
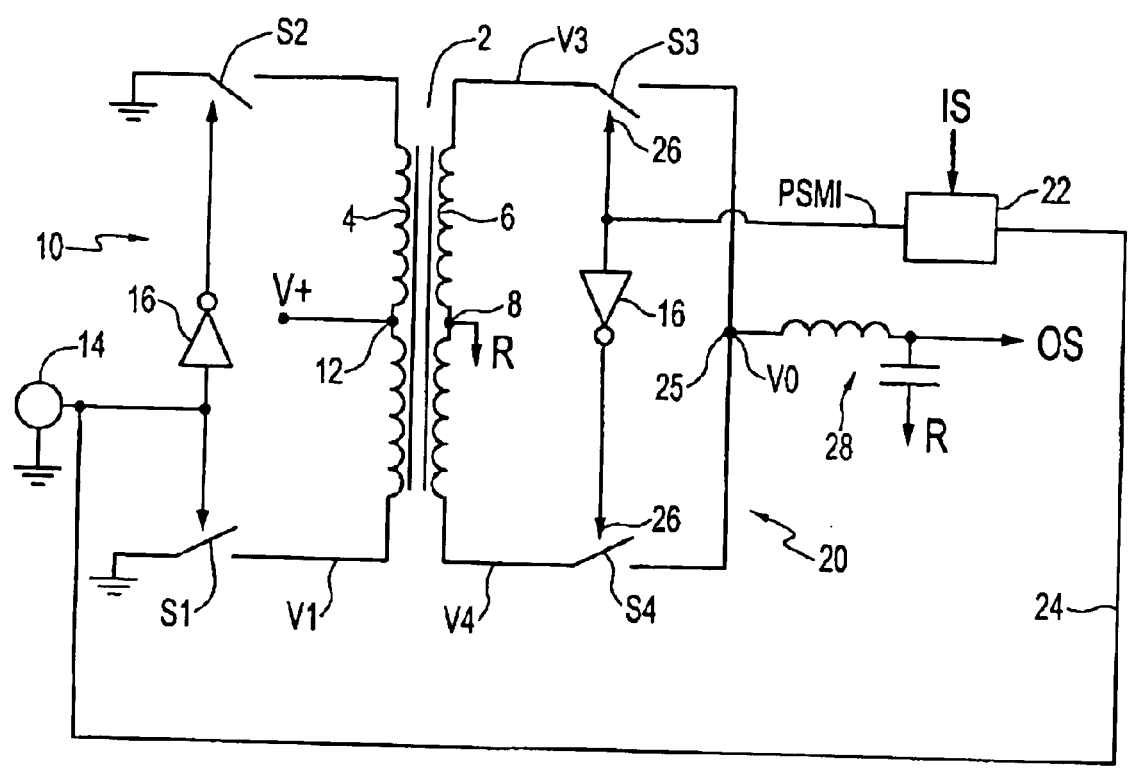
FIG. 1 is a schematic circuit drawing of an amplifier of the invention using a conventional transformer with separate primary and secondary coils.

DETAILED DESCRIPTION OF THE ILLUSTRATED EMBODIMENTS:

FIG. 1 illustrates schematic circuit diagram of an amplifier apparatus of the invention for amplifying an input signal IS. The apparatus comprises a transformer 2 comprising a primary coil 4 and a secondary coil 6. A center tap 8 on the secondary coil 6 is connected to a reference point R. The reference point R is typically ground, but may be a point with a reference voltage, from which other voltages in the apparatus are measured.

A constant periodic signal generator 10 is operatively connected to the primary coil 4. In the illustrated embodiment, the periodic signal generator 10 comprises a center tap 12 on the primary coil that is maintained at a positive primary voltage V+. A clock signal generator 14 controls first switch S1, and an inverter 16 operates to open switch S2 when S1 is closed, and to close S2 when S1 is open. In the illustrated embodiment of FIG. 1, the voltages V+ and V1 on the primary side are relative to ground. The voltage at reference point R can be at ground, or at some other selected voltage, and voltages V3, V4, and VO are measured relative to the voltage at R.

Figure 2:
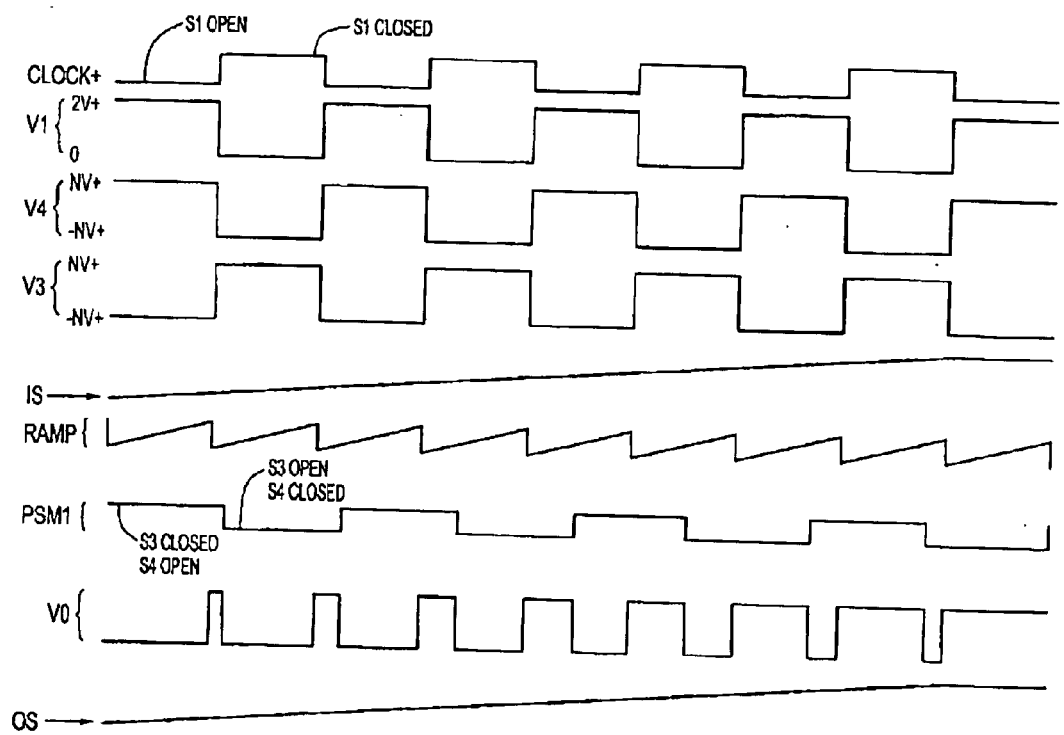
FIG. 2 is a schematic drawing of the voltages at various points in the apparatus.

FIG. 2 illustrates that in the embodiment shown the clock signal is a square wave, however depending on the application a distorted square wave, a triangle wave, a distorted triangle wave, a sinusoidal wave, a distorted sinusoidal wave, and like waves could be utilized as well. Thus the voltage at point V1 is a square wave as illustrated in FIG. 2 varying between 0 and 2V+. The voltage generated at points V3, V4 at opposite ends of the secondary transformer coil 6 are thus inverse to each other, as indicated in FIG. 2. The voltage NV+ will depend on the turns ratio between the primary and secondary coils, and so can be higher or lower than V+, as desired.

In this way, for example, rectified household voltage of 169 volts on the primary side can be reduced to 12 or 24 volts on the secondary side for easier safe installation, wiring, etc.

A signal reception and amplification circuit 20 is connected to the secondary coil. The signal reception and amplification circuit 20 comprises a first switch S3 connected at a hot terminal thereof to a first end of the secondary coil, indicated at V3 and at a switched terminal thereof to an output node 25. A second switch S4 is connected at a hot terminal thereof to a second end of the secondary coil, indicated at V4, and at a switched terminal thereof to the output node 25. Thus the voltage V3 at the hot terminal of the first switch S3 is inverse to the voltage V4 at the hot terminal of the second switch S4, with respect to the reference point R.

The signal reception and amplification circuit 20 further comprises a phase shift modulator 22 operative to convert the input signal IS to a phase shift modulated input signal PSMI with respect to the constant periodic signal that is correlated to the phase shift modulator 22 by connection through wire 24 to the clock signal generator 14. The phase shift modulated input signal PSMI is connected to a control input 26 of the first switch S3 such that the first switch S3 turns on and off in response to changes in the phase shift modulated input signal PSMI.

An inverter control 16 is operatively connected to the control input 26 of each switch, and is operative to turn switch S4 off when switch S3 is turned on, and operative to turn the switch S4 on when switch S3 is turned off.

Thus, as illustrated in FIG. 2, the phase shift modulator 22 uses a ramp signal to convert the input signal IS to the phase shift modulated input signal PSMI. When the phase shift modulated input signal PSMI is high, S3 is on and S4 is off, so that the output voltage VO at the output node 25 is equal to V3. Conversely when the phase shift modulated input signal PSMI is low, S3 is off and S4 is on so that the output voltage VO at the output node 25 is equal to V4. The resulting voltage VO at the output node 25 is illustrated in FIG. 2. The filter 28 is connected to reference point R. The filter input is connected to the output node 25, and the filter converts the voltage VO at the output node 25 into the amplified output signal OS illustrated in FIG. 2. The filter 28 can be incorporated into a transducer such as a speaker or the like, as is known in the art.

Supply pumping is not a problem in the embodiment of FIG. 1, since the current in the periodic signal generator 14 is positive for one half of the cycle and negative for the other half, resulting in a net of zero.

Figure 3:
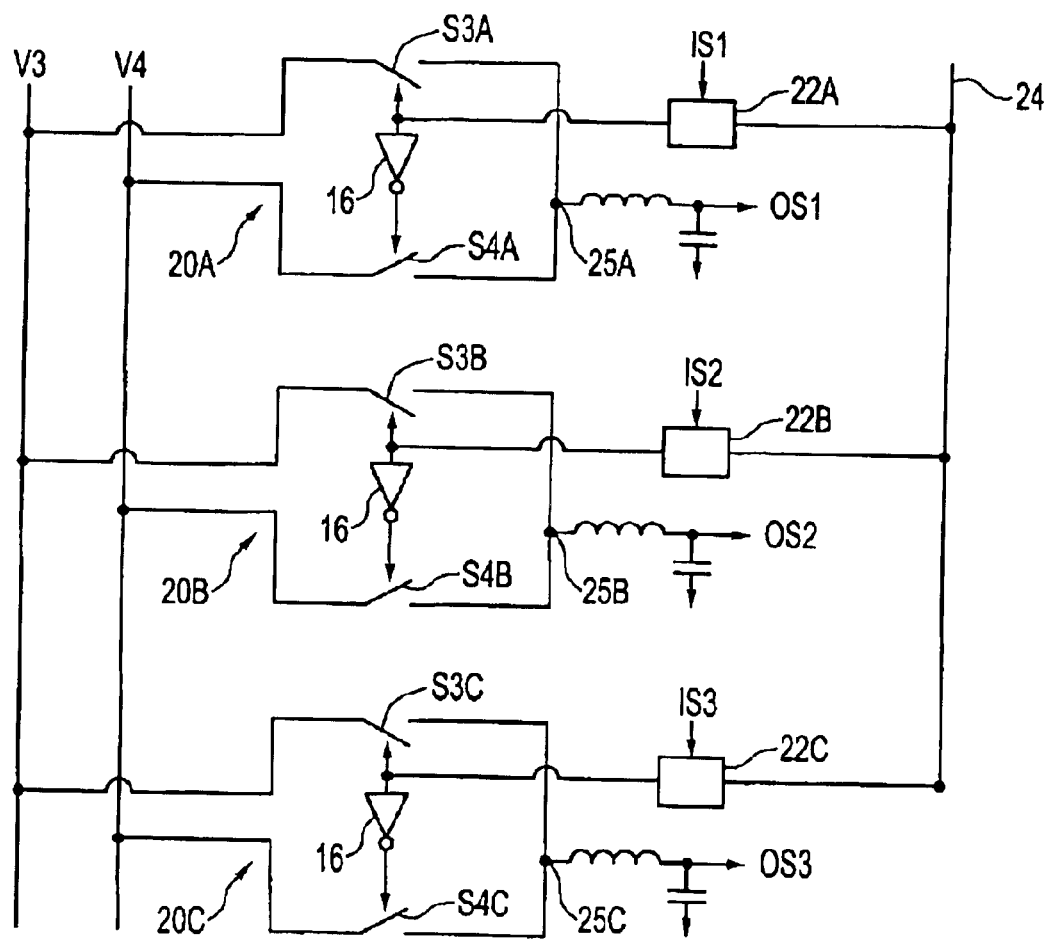
FIG. 3 is a schematic circuit drawing of embodiment for amplifying multiple input signals.

FIG. 3 illustrates a multiple channel amplifier comprising a plurality of signal reception and amplification circuits 20A, 20B, 20C connected in parallel to the secondary coil 6 of FIG. 1 such that voltages the voltages V3 and V4 of FIG. 1 are available at switches S3A, S4A, S3B, S4B, S3C, S4C as indicated. The inverters 16 operate as in the signal reception and amplification circuit 20 of FIG. 1. The phase shift modulators 22A, 22B, 22C are connected to the clock signal generator by wire 24, and receive respective input signals IS1, IS2, IS3 and turn the switches S3A, S4A, S3B, S4B, S3C, S4C on and off as in the embodiment of FIG. 1. Voltages at the output nodes 25A, 25B, 25C, are converted by filters into output signals OS1, OS2, OS3.

Figure 4:
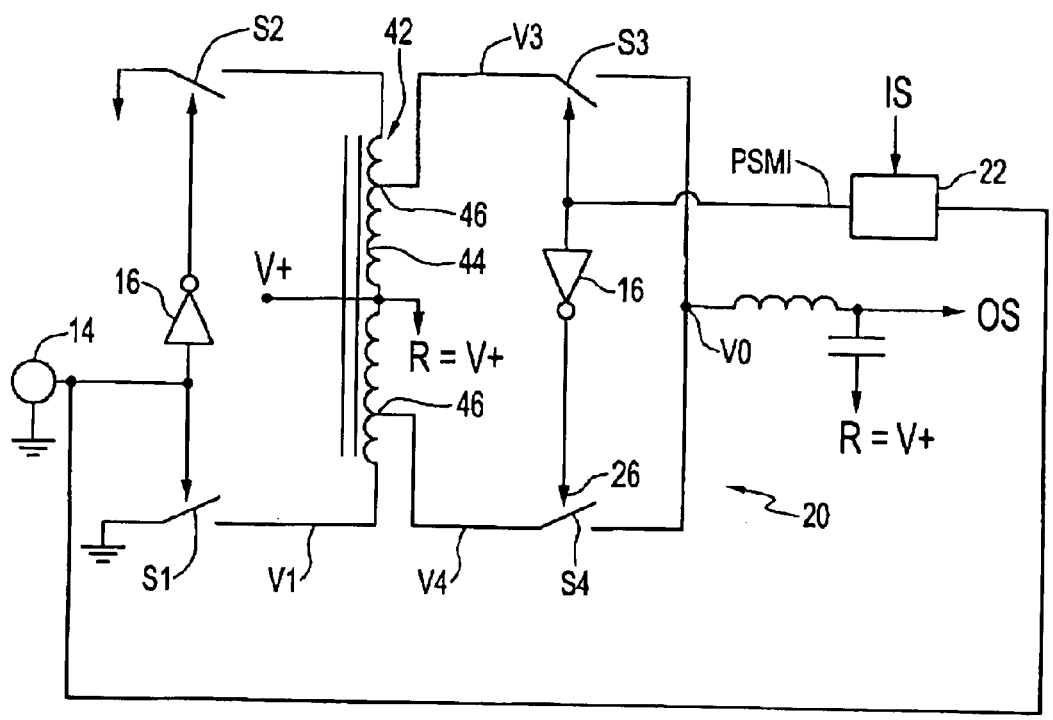
FIG. 4 is a schematic circuit drawing of an alternate embodiment of the invention using as a voltage transforming device an autotransformer with a common primary and secondary coil.

FIG. 4 illustrates an alternate embodiment of the invention wherein the voltage transforming device is an autotransformer 42. The secondary side of the transformer taps into the single coil 44 at a center tap 48, and at end taps 46 such that voltages V3 and V4 are inverse, relative to the reference voltage. Using an autotransformer as illustrated, the reference voltage is equal to the primary voltage V+, since there is no electrical isolation as in the embodiment of FIG. 1.

In FIG. 4, the signal reception and amplification circuit 20 operates the same as in the embodiment of FIG. 1. Using a square wave clock signal as illustrated in FIG. 2, the voltages in FIG. 4 will be the same as in FIG. 2, except that V3 and V4 are measured relative to V+. In the illustrated embodiment of FIG. 1, the voltage at reference point R can be at ground, or at some other selected voltage, and voltages V3, V4, and VO are measured relative to the voltage at R. The voltage of the input signal IS is isolated and not relative to anything in the circuit.

As those skilled in the art will recognize, the clock signal could be other than a square wave, which has been illustrated for ease of description. The clock signal could be sinusoidal, triangular, or such other waveforms that might be useful for different applications as required. The results of any particular clock signal waveform can be readily simulated with present software to predict the suitability of a particular waveform.

Figure 5:
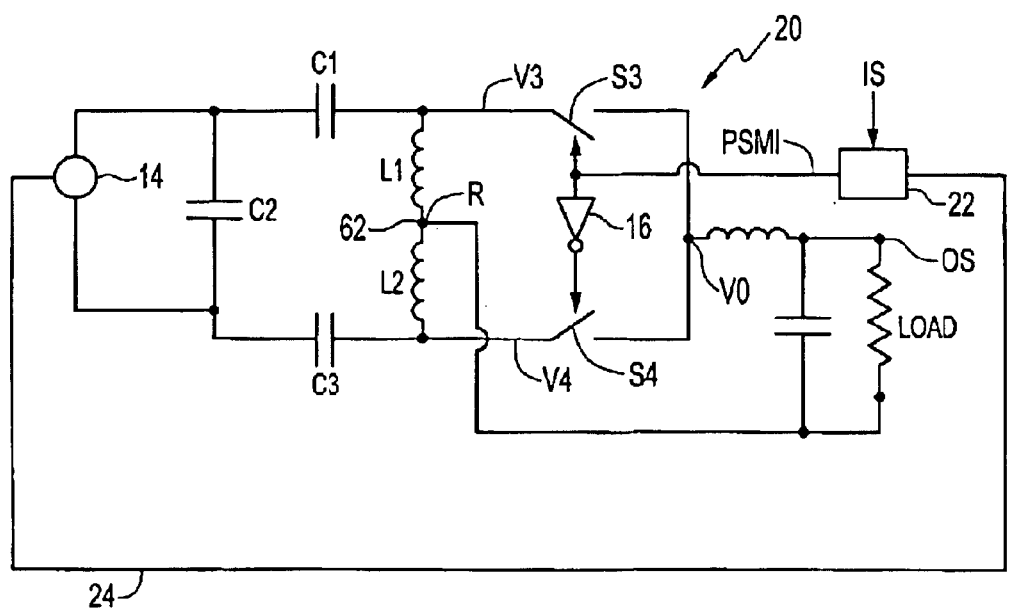
FIG. 5 is a schematic circuit drawing of an alternate embodiment of the invention using as a voltage transforming device a resonant tank circuit.

FIG. 5 roughly illustrates an embodiment wherein the voltage transforming device is a resonant tank circuit comprising inductors L1, L2 and capacitors C1, C2, C3. The "primary side" comprises C1, C2, and C3, receiving the clock signal from the generator 14, while the "secondary side" comprises L1 and L2. The voltages at V3 and V4 are again inverse relative to the reference voltage at R, and correspond to the voltages V3, V4 in prior embodiments. The "center tap" on the secondary is indicated at 62. In the signal reception and amplification circuit 20, the input signal IS, as in the prior embodiments, is converted to a phase shift modulated input signal PSMI by phase shift modulator 22 connected to the clock signal generator 14 by wire 24. The switch S3 is operated by the phase shift modulated input signal PSMI, and inverter 16 operates switches S3, S4 as in prior embodiments.

Again the output signal OS, connected to one end of the LOAD, is relative to the voltage at the reference point R at the center tap 62, connected to the opposite end of the LOAD. The LOAD thus receives the correct amplified signal OS.

The foregoing is considered as illustrative only of the principles of the invention. Further, since numerous changes and modifications will readily occur to those skilled in the art, it is not desired to limit the invention to the exact construction and operation shown and described, and accordingly, all such suitable changes or modifications in structure or operation which may be resorted to are intended to fall within the scope of the claimed invention.

I claim:

1. An amplifier apparatus for amplifying an input signal, the apparatus comprising:
   a transformer comprising a primary coil and a secondary coil having a center tap on the secondary coil connected to a reference point;
   a constant periodic signal generator operatively connected to the primary coil;
   a signal reception and amplification circuit comprising:
      a first switch connected at a hot terminal thereof to a first end of the secondary coil and at a switched terminal thereof to an output node;
      a second switch connected at a hot terminal thereof to a second end of the secondary coil and at a switched terminal thereof to the output node, such that a first voltage at the hot terminal of the first switch is substantially inverse to a second voltage at the hot terminal of the second switch, with respect to the reference point;
      a phase shift modulator operative to convert the input signal to a phase shift modulated input signal with respect to the constant periodic signal, and wherein the phase shift modulated input signal is connected to a control input of the first switch such that the first switch turns on and off in response to changes in the phase shift modulated input signal;
      an inverter control operatively connected to the control input of each switch, and operative to turn the second switch off when the first switch is turned on, and operative to turn the second switch on when the first switch is turned off; and
      a filter connected to the reference point and operatively connected at an input end thereof to the output node, and at an output end thereof to an amplified signal output.

2. The apparatus of claim 1 wherein the constant periodic signal is one of a square wave, a distorted square wave, a triangle wave, a distorted triangle wave, a sinusoidal wave, and a distorted sinusoidal wave.

3. The apparatus of claim 1 wherein the filter is incorporated into a transducer.

4. A multiple channel amplifier comprising the apparatus of claim 1 and further comprising a plurality of signal reception and amplification circuits, each connected to the first and second ends of the secondary coil, and each connected to receive the input signal of a separate channel.

5. An amplifier apparatus for amplifying an input signal, the apparatus comprising:
   a voltage transforming device comprising a primary input and a secondary output having a center tap on the secondary output connected to a reference point;
   a constant periodic signal generator operatively connected to the primary input;
   a signal reception and amplification circuit comprising:
      a first switch connected at a hot terminal thereof to a first end of the secondary output and at a switched terminal thereof to an output node;
      a second switch connected at a hot terminal thereof to a second end of the secondary output and at a switched terminal thereof to the output node, such that a first voltage at the hot terminal of the first switch is substantially inverse to a second voltage at the hot terminal of the second switch, with respect to the reference point;

a phase shift modulator operative to convert the input signal to a phase shift modulated input signal with respect to the constant periodic signal, and wherein the phase shift modulated input signal is connected to a control input of the first switch such that the first switch turns on and off in response to changes in the phase shift modulated input signal;

an inverter control operatively connected to the control input of each switch, and operative to turn the second switch off when the first switch is turned on, and operative to turn the second switch on when the first switch is turned off; and a filter connected to the reference point and operatively connected at an input end thereof to the output node, and at an output end thereof to an amplified signal output.

6. The apparatus of claim 5 wherein the constant periodic signal is one of a square wave, a distorted square wave, a triangle wave, a distorted triangle wave, a sinusoidal wave, and a distorted sinusoidal wave.

7. The apparatus of claim 5 wherein the filter is incorporated into a transducer.

8. A multiple channel amplifier comprising the apparatus of claim 5 and further comprising a plurality of signal reception and amplification circuits, each connected to the first and second ends of the secondary output, and each connected to receive the input signal of a separate channel.

9. The apparatus of claim 5 wherein the voltage transforming device comprises one of a conventional electrically isolated transformer, an autotransformer, and a resonant tank circuit.

* * * * *